(12) United States Patent
Bock et al.

(10) Patent No.: US 7,285,470 B2
(45) Date of Patent: Oct. 23, 2007

(54) METHOD FOR THE PRODUCTION OF A BIPOLAR SEMICONDUCTOR COMPONENT, ESPECIALLY A BIPOLAR TRANSISTOR, AND CORRESPONDING BIPOLAR SEMICONDUCTOR COMPONENT

(75) Inventors: Josef Bock, Munich (DE); Thomas Meister, Taufkirchen (DE); Reinhard Stengl, Stadtbergen (DE); Herbert Schafer, Hohenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 135 days.

(21) Appl. No.: 11/240,297

(22) Filed: Sep. 30, 2005

(65) Prior Publication Data

US 2006/0040456 A1    Feb. 23, 2006

Related U.S. Application Data

(63) Continuation of application No. PCT/EP2004/003805, filed on Apr. 8, 2004.

(30) Foreign Application Priority Data

Apr. 10, 2003    (DE)    .............................. 103 16 529.0

(51) Int. Cl.
*H01L 21/331*    (2006.01)
(52) U.S. Cl. ...................................... 438/309; 438/364
(58) Field of Classification Search ................ 438/309, 438/343, 349, 364–366
See application file for complete search history.

(56) References Cited

U.S. PATENT DOCUMENTS 6,498,382 B2    12/2002    Hirler et al.

(Continued)

FOREIGN PATENT DOCUMENTS

DE    693 20 520    10/1998

(Continued)

OTHER PUBLICATIONS

International Search Report dated Aug. 16, 2004.

(Continued)

*Primary Examiner*—Mark V. Prenty
(74) *Attorney, Agent, or Firm*—Jenkins, Wilson, Taylor & Hunt, P.A.

(57) ABSTRACT

The invention relates to a method for producing a bipolar semiconductor element, especially a bipolar transistor, and a corresponding bipolar semiconductor component. The inventive method comprises the following steps: a first semiconductor area (32, 34) of a first conductivity type (p) is provided above a semiconductor substrate (1); a connecting area (40) of the first conductivity type (p<+>) is provided above the semiconductor area (32, 34); a first insulating area (35") is provided above the connecting area (40); a window (F) is formed within the first insulating area (35") and the connecting area (40) so as to at least partly expose the semiconductor area (32, 34); a sidewall spacer (80) is provided in the window (F) in order to insulate the connecting area (40); a second semiconductor area (60) of the second conductivity type (n+) is provided so as to cover the sidewall spacer (80) and a portion of the surrounding first insulating area (35"); the surrounding first insulating area (35") and the sidewall spacer (80) are removed in order to form a gap (LS) between the connecting area (40) and the second semiconductor area (60); and the gap (LS) is sealed by means of a second insulating area (100) while a gaseous atmosphere or a vacuum atmosphere is provided inside the sealed gap (LS).

5 Claims, 9 Drawing Sheets

U.S. PATENT DOCUMENTS

| | | | |
|---|---|---|---|
| 6,551,889 B2 * | 4/2003 | Kovacic | 438/312 |
| 2001/0022381 A1 | 9/2001 | Gonzalez et al. | |
| 2001/0053584 A1 | 12/2001 | Chantre et al. | |

FOREIGN PATENT DOCUMENTS

| | | |
|---|---|---|
| DE | 197 48 523 | 5/1999 |
| DE | 199 58 062 | 7/2001 |
| DE | 101 25 019 | 12/2002 |

OTHER PUBLICATIONS

German Office Action dated Jan. 5, 2004.

* cited by examiner

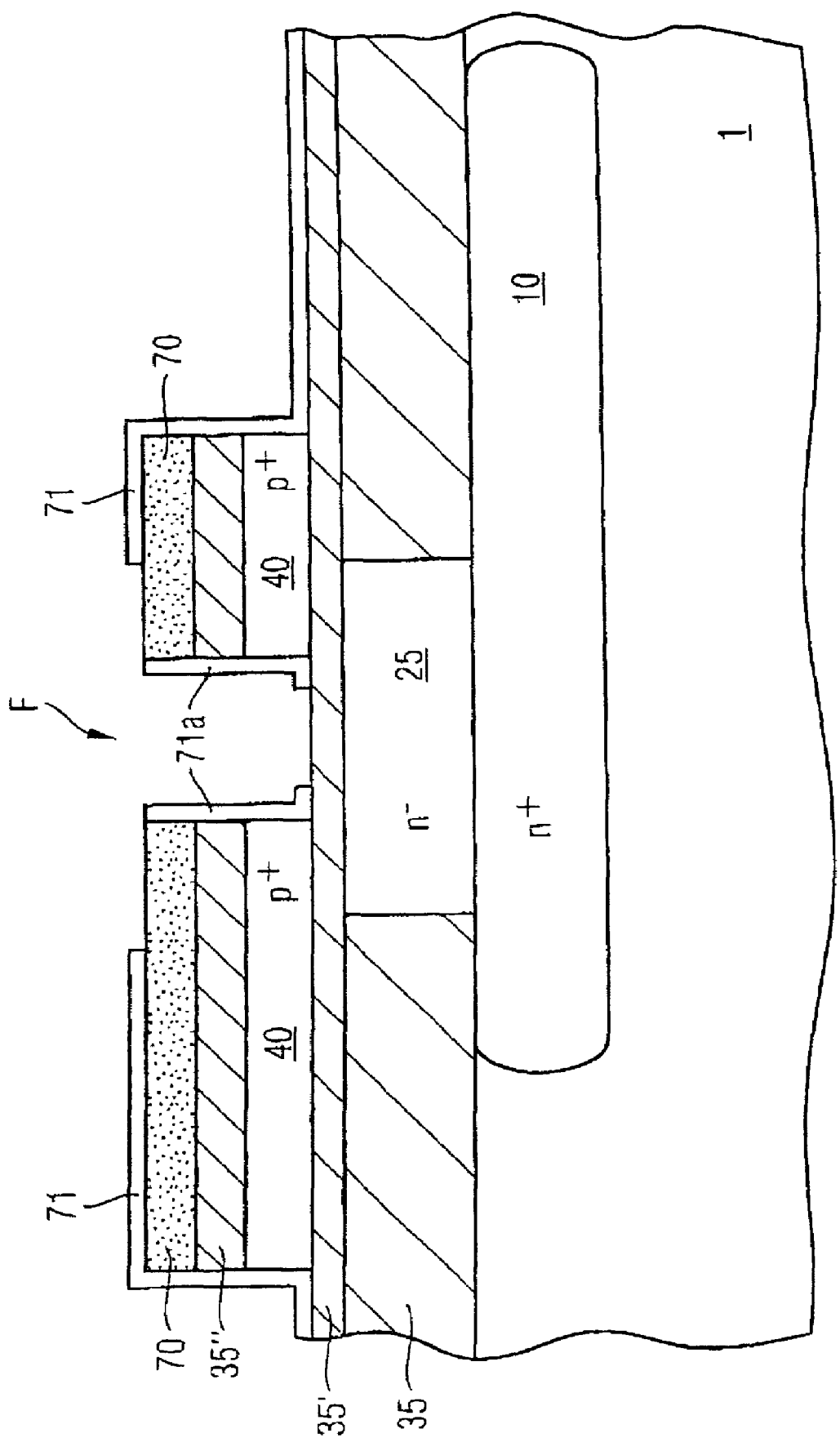

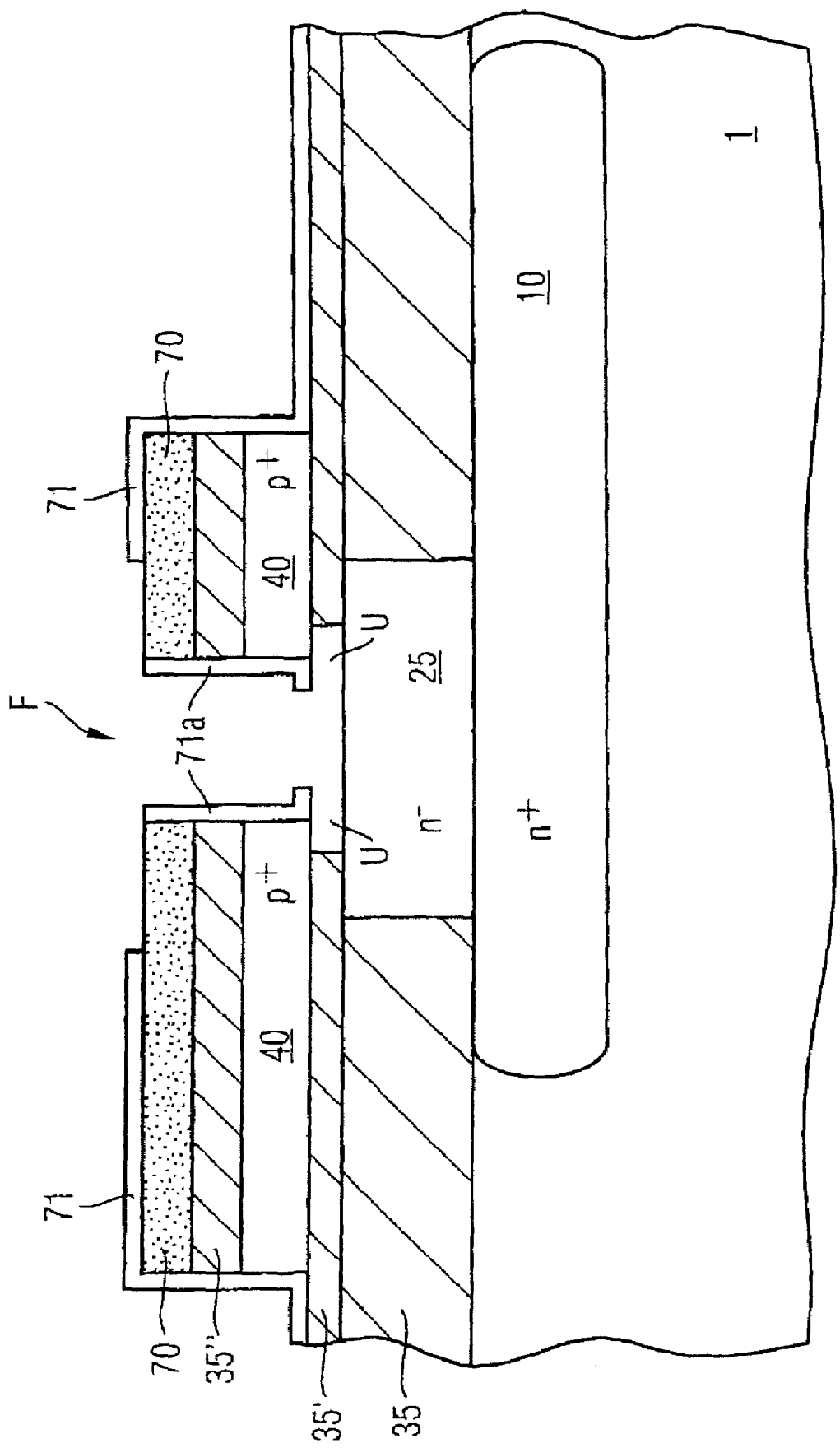

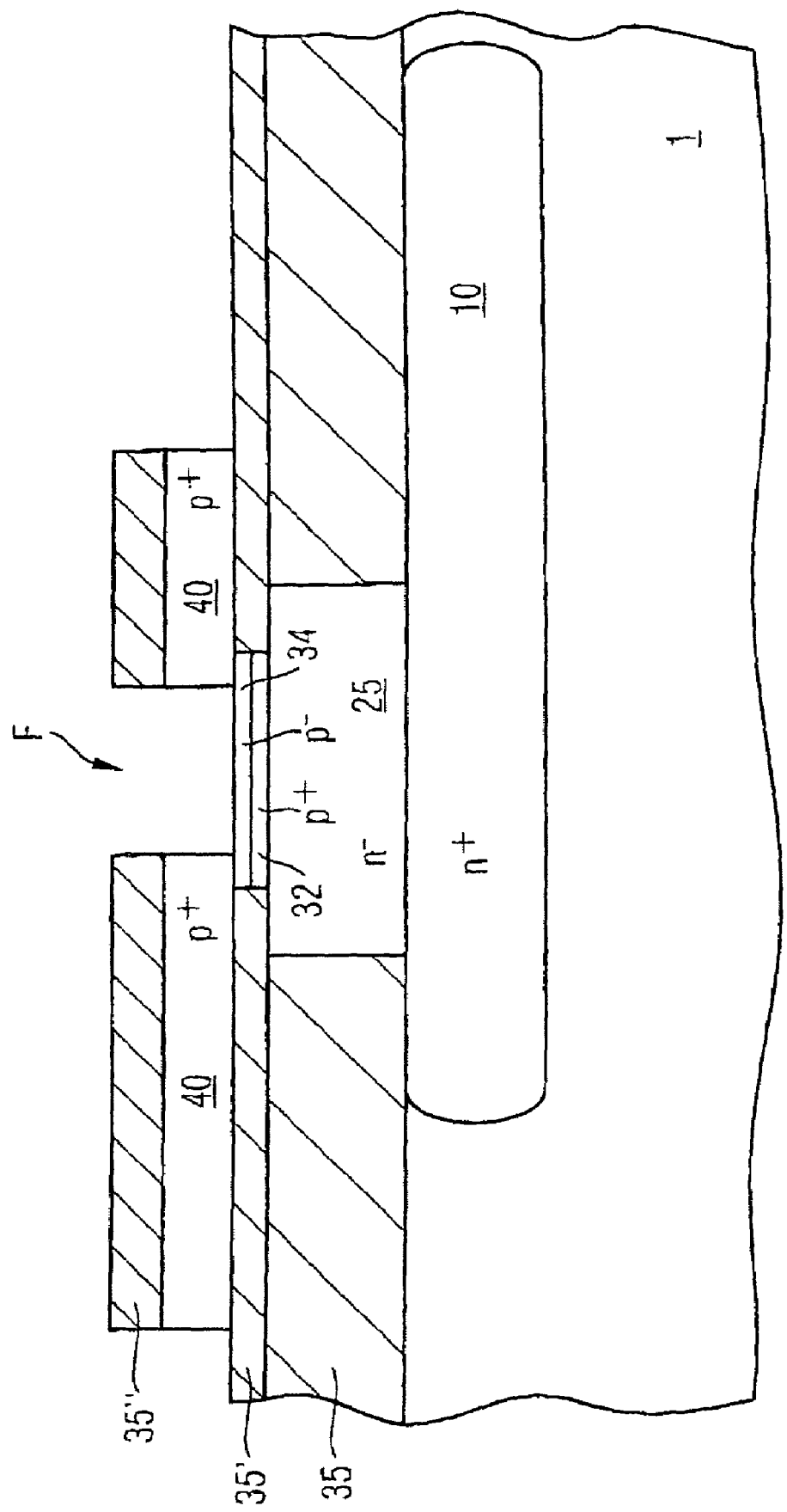

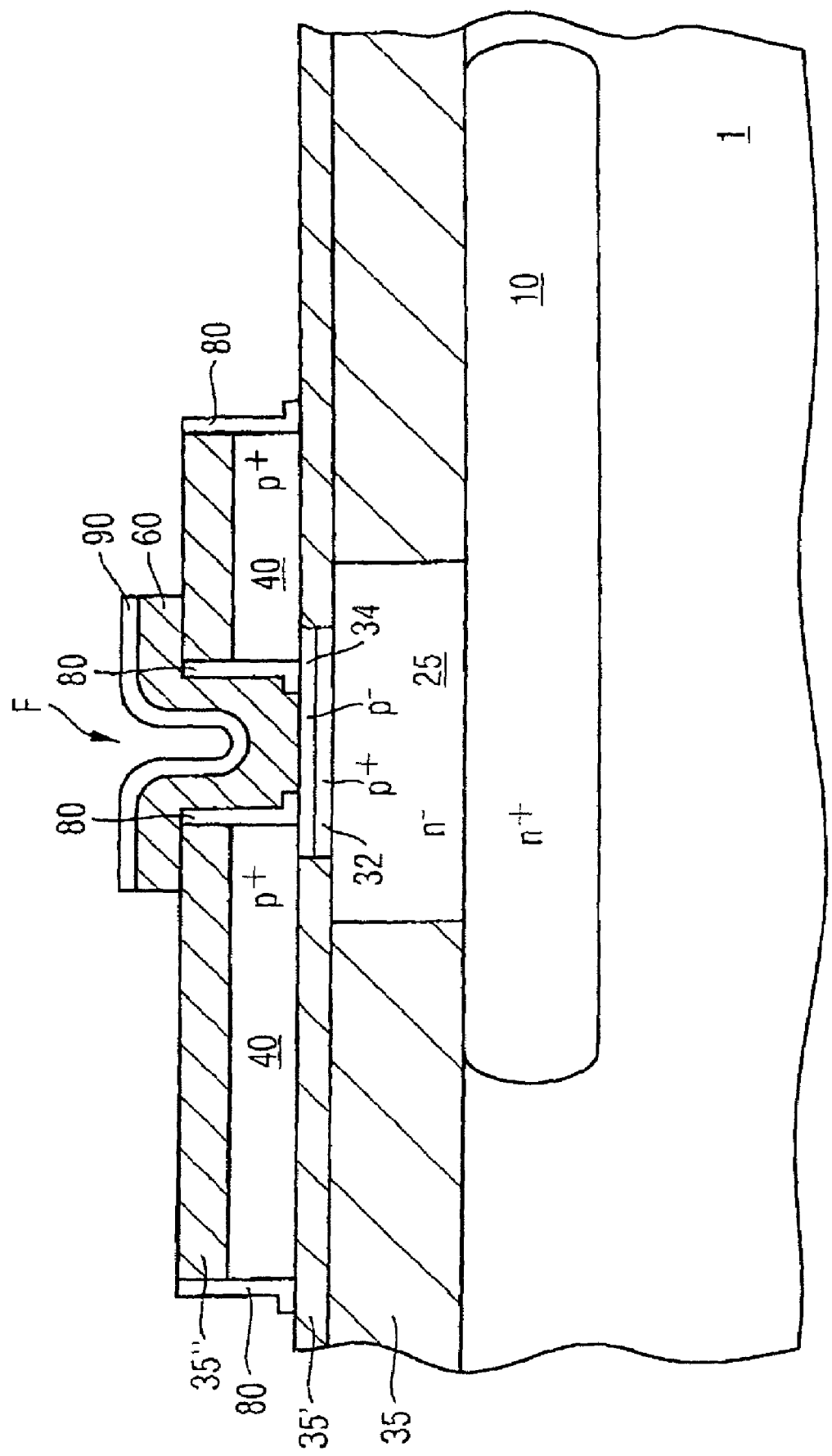

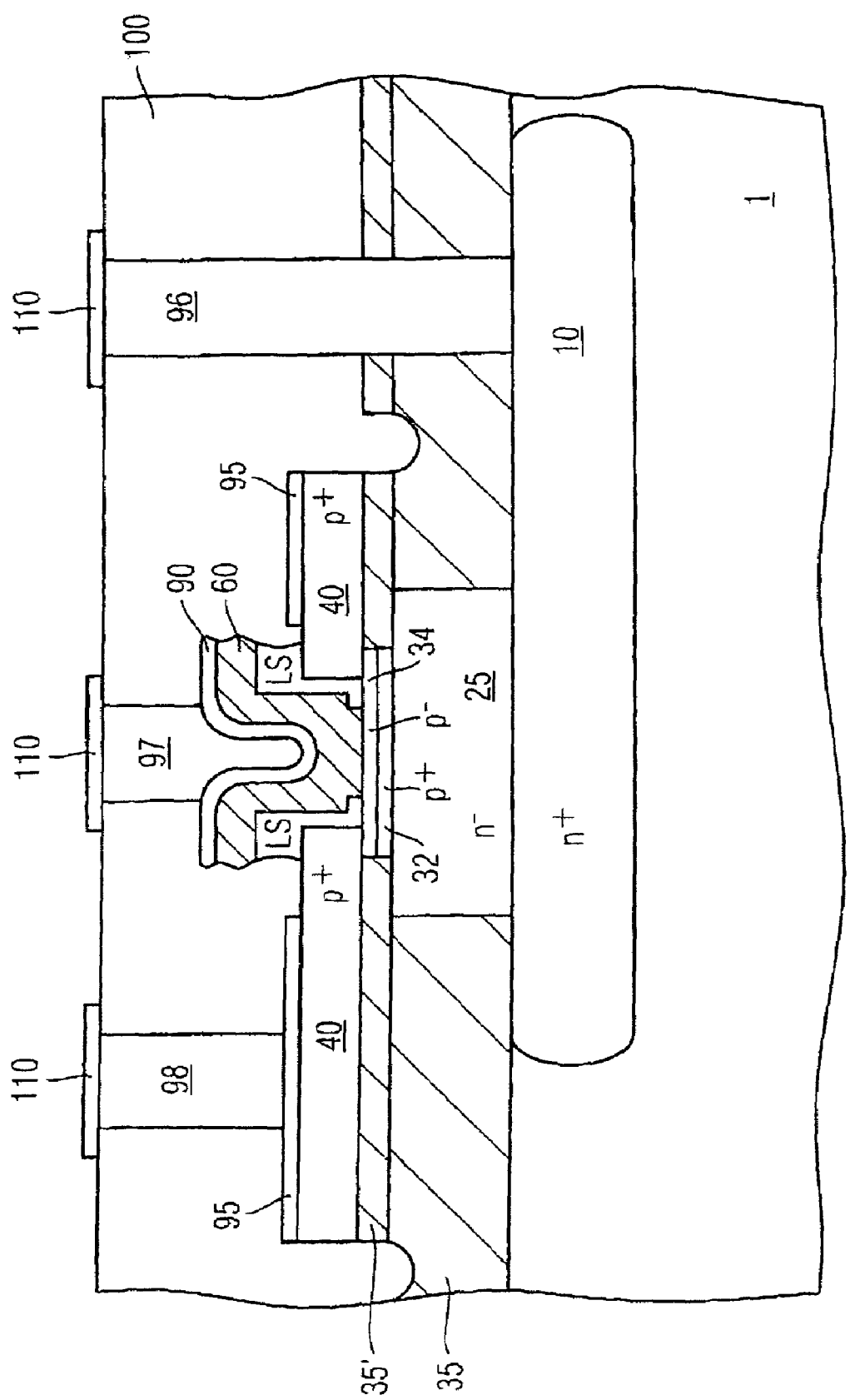

METHOD FOR THE PRODUCTION OF A BIPOLAR SEMICONDUCTOR COMPONENT, ESPECIALLY A BIPOLAR TRANSISTOR, AND CORRESPONDING BIPOLAR SEMICONDUCTOR COMPONENT

RELATED APPLICATIONS

This application is a continuation of PCT patent application number PCT/EP2004/003805, filed Apr. 8, 2004, which claims priority to German patent application number 10316529.0, filed Apr. 10, 2003, the disclosures of each of which are incorporated herein by reference in their entirety.

TECHNICAL FIELD

The present invention relates to a method for the production of a bipolar semiconductor component, especially a bipolar transistor, and a corresponding bipolar semiconductor component.

BACKGROUND ART

In order to electrically insulate the terminal regions of the emitter and base in bipolar transistors from one another, in principle two methods are available: firstly, the terminal regions may be defined with the aid of photolithography for the emitter and base regions and be patterned with the aid of etching technology. Such transistors are therefore called aligned transistors. The distance between emitter and base terminal is then given by the minimum available lithography width. Since lithographic methods can only achieve resolutions of as far as 0.1 µm, this method is not suitable for scaled bipolar transistors in which the emitter is only a few 0.1 µm wide and the insulation region between the emitter and base should be even significantly smaller (typically a few 10 nm). Moreover, in the case of an alignment of emitter to base plane, an asymmetry always occurs in the current flow since, on account of the alignment tolerance of emitter to base plane, one side of the emitter is always nearer to the base terminal zone than the opposite side. Aligned transistors are therefore unsuitable for modern scaled, very high-performance transistors.

Almost all present-day transistors are therefore embodied as transistors that are self-aligned through an emitter window. The emitter and base terminal regions are formed in this case by polysilicon layers isolated from one another by a dielectric (silicon oxide or silicon nitride), for which reason they are also referred to as DPSA (double polysilicon self-aligned) transistors.

The dielectric is formed as a "spacer", that is to say produced by anisotropically etching back a layer deposited over the whole area, so that the spacers remain as etching residues in the emitter window. In this case, the spacer width is determined by the thickness of the spacer layer and may therefore be significantly smaller than structures produced by lithographic methods (in principle just a few nm; a few ten 10 nm are typical nowadays). Therefore, this method is suitable for the production of extremely scaled DPSA transistors.

The DPSA transistor may contain both an implanted Si base and a epitaxially deposited SiGe base. The collector is usually connected via a buried layer buried in the substrate (also referred to as subcollector). On account of its lateral and vertical scalability and the small parasitic capacitance and resistance components, the DPSA transistor structure is best suited to very high speed applications.

DPSA transistors and corresponding production methods are disclosed, e.g. in T. F. Meister et al., IEDM Technical Digest 1995, p. 739-741 or in T. H. Ning et al., Self-Aligned Bipolar Transistor for High-Performance and Low-Power-Delay VLSI, IEEE Transactions on Electron Devices, Vol. ED-28, No. 9, pp. 1010-1013, 1981 or in DE 199 58 062 C2.

FIG. 2 is a schematic illustration of a known DPSA transistor as disclosed in T. F. Meister et al., IEDM Technical Digest 1995, p. 739-741.

In FIG. 2, reference symbol 1 designates a silicon semiconductor substrate, 10 designates an $n^+$-type subcollector region in the form of a buried layer, 20 designates $p^+$-type channel blocking regions, 25 designates an $n^-$-type collector region, 30 designates a p-type base region, 35 and 35a designate a respective CVD insulation oxide layer, 15 designates a LOCOS insulation oxide layer, 40 designates a $p^+$-type base terminal, 45 designates an $n^+$-type collector contact, 55 designates a double spacer comprising silicon oxide/silicon nitride, and 60 designates an $n^+$-type emitter contact.

FIGS. 3a-c are schematic illustrations of the method steps with regard to the emitter contact with oxide spacer insulation of a customary method for the production of a DPSA transistor, in contrast to FIG. 2 reference symbol 55' designating this single spacer made of oxide. Reference symbol F designates the emitter window in the layers 35 and 40.

In order to produce the $n^+$-type emitter contact, in the case of the DPSA transistor, after the formation of the oxide spacer 35' covering the side walls of the emitter window F, on the active $p^+$-type base region, an $n^+$-doped (implanted or doped in situ) $n^+$-type polysilicon layer 60 is applied in polycrystalline fashion on the active transistor zone and also on the surrounding insulation regions.

Afterward, the $n^+$-type polysilicon layer 60 is patterned anisotropically by means of a phototechnology for the purpose of forming the final emitter contact 60 and the $n^+$-type dopant is driven e.g. 20 nm into the underlying monocrystalline Si material of the base region 30 by means of a thermal step (FIG. 3c). This gives rise to an $n^+$-type emitter composed of a monocrystalline portion 31 and a polycrystalline portion 60, between which is situated a very thin natural oxide layer 36 that forms after the spacer etching.

SUMMARY OF THE INVENTION

It is an object of the invention to specify an improved method for the production of a bipolar semiconductor component, especially a bipolar transistor, and a corresponding bipolar semiconductor component which exhibits high-frequency properties that are improved even further.

This object is achieved by means of a method for the production of a bipolar semiconductor component, especially a bipolar transistor, according to claim 1 and a corresponding bipolar semiconductor component according to claim 6.

The idea on which the present invention is based consists in producing a self-aligned gas or vacuum insulation by firstly producing a spacer between the base and emitter terminal regions, which, after the completion of the emitter, is removed again selectively with respect to the emitter and base terminal regions, thus giving rise to a gap between said terminal regions. Afterward, by means of a not completely conformal deposition of a dielectric, the gap between emitter and base terminal regions is closed off and filled with a predetermined gas atmosphere or evacuated, but not filled with a solid dielectric again.

Not only the high-frequency properties but also the emitter-base degradation should be significantly improved by such a gas or vacuum spacer since a solid dielectric in which traps can be produced is no longer present. It should thus be possible to realize transistors which, for the same dopant distribution, have better long-term stability than transistors with a dielectric. The lower susceptibility to hot carrier stress could also be utilized for using higher dopant concentrations in the emitter-base region and thus reducing the base resistance. This would produce e.g. transistors having a higher maximum oscillation frequency, shorter gate delay times and lower noise.

Components according to the invention, in comparison with components fabricated nowadays, can be produced without significantly changing the process implementation. All that is needed is a modified or additional wet-chemical etching and a non-conformal deposition. Thus, the improved electrical properties are also produced without appreciable additional costs.

The respective subclaims relate to preferred developments.

In accordance with one preferred development, the first semiconductor region is a base region of a bipolar transistor, below which an associated collector region of the second conduction type is formed beforehand, the second semiconductor region being the associated emitter region.

In accordance with a further preferred development, the first insulation region and the sidewall spacer (80) are made of the same semiconductor material, in particular silicon oxide, and are removed in the same etching process selectively with respect to the first and second semiconductor regions.

In accordance with a further preferred development, the second insulation region is formed by non-conformal deposition and planarization of an insulation material.

In accordance with a further preferred development, the semiconductor component is a DPSA transistor.

The invention is explained in more detail below on the basis of the exemplary embodiments with reference to the drawings.

BRIEF DESCRIPTION OF THE DRAWINGS

FIGS. 1a-g show schematic illustrations of the method steps of an embodiment according to the invention of the method for the production of a DPSA transistor;

DETAILED DESCRIPTION OF THE INVENTION

Identical reference symbols in the figures designate identical or identically acting elements.

Figure 3A:
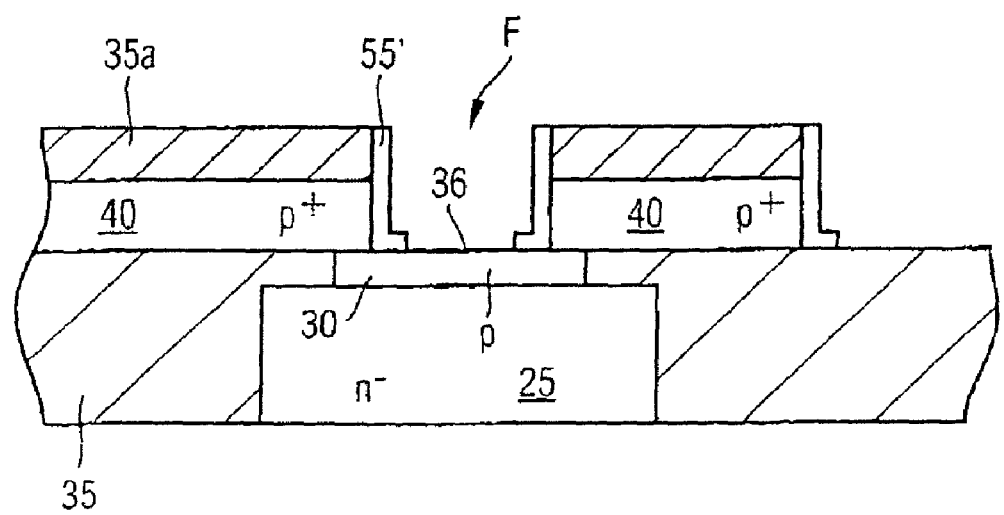
FIGS. 3a-c show schematic illustrations of the method steps with regard to the emitter contact with oxide spacer insulation of a customary method for the production of a DPSA transistor.
Figure 3B:
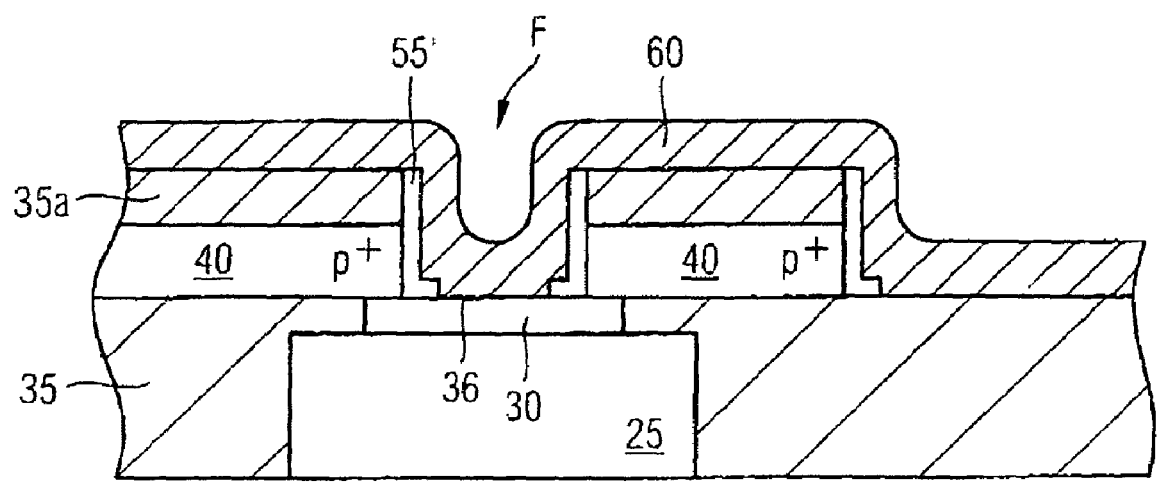
Figure 3C:
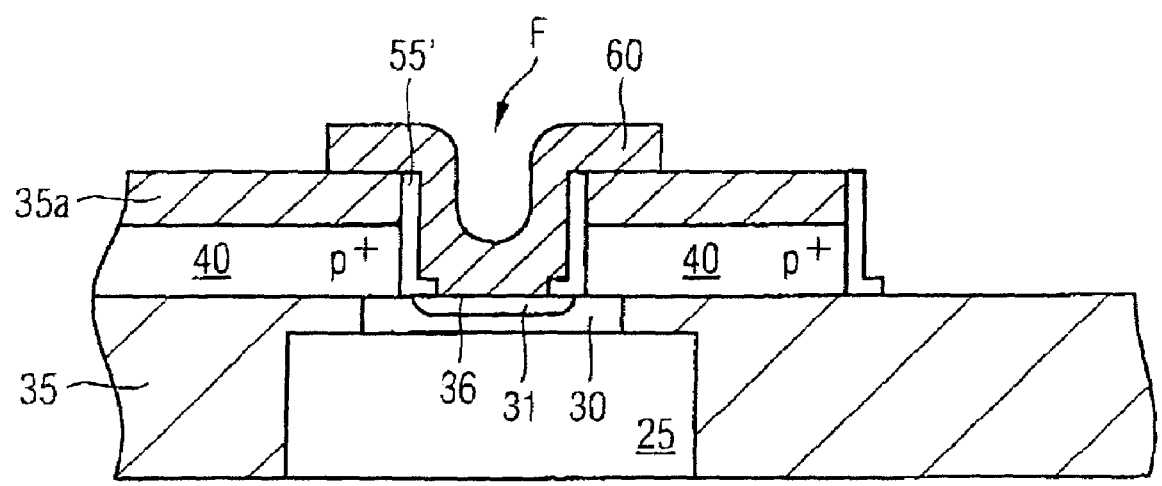

The concepts on which the present invention is based commence at FIG. 3c. The emitter and base electrodes 60, 40 of the known DPSA transistor together with the intervening dielectric of the spacer 55' form a capacitor, the capacitance Csp of which increases the emitter-base capacitance $C_{BE}$ of the transistor. The latter is one of the most important performance-determining variables of a bipolar transistor. Thus, the following holds true, e.g. for the transition frequency of a bipolar transistor:

$$\frac{1}{2\pi f_1} = \tau_f + (R_C + R_E)C_{BC} + \frac{C_{BE} + C_{BC}}{I_C}U_T \quad \text{(Equation 1)}$$

where $f_T$ denotes transition frequency $\tau_f$ denotes transit time $R_C$ denotes collector resistance $R_E$ denotes emitter resistance $C_{BC}$ denotes base-collector capacitance $C_{BE}$ denotes base-emitter capacitance $I_C$ denotes collector current $U_T$ denotes thermal voltage.

It is evident that, for small collector currents, the transition frequency is dominated by the term proportional to $1/I_C$. The latter is in turn dominated by the base-emitter capacitance since $C_{BE}$ is typically a few factors greater than $C_{BC}$. For fast transistors, that is to say a high transition frequency, $C_{BE}$ must therefore be minimized.

The active base-emitter capacitance in the emitter-base region is continuously decreased as a result of the scaling of the components, by virtue of the emitter area being reduced. At the same time this also necessitates the reduction of the spacer layer thickness in order that the spacer can be produced in the ever smaller emitter window without completely filling the latter. This means, however, that the spacer capacitance rises, which is inversely proportional to the layer thickness:

$$C_{sp} = \varepsilon_r \cdot \frac{A}{d_{sp}} \quad \text{(Equation 2)}$$

where $C_{sp}$ denotes spacer capacitance $\varepsilon_r$ denotes relative permittivity of the spacer material A denotes area of the spacer capacitance (emitter to base polysilicon)

$d_{sp}$ denotes thickness of the spacer layer.

In present-day transistors (active emitter width e.g. typically 200 nm and spacer layer thickness e.g. typically 40 nm), the ratio of active base-emitter capacitance $C_{BEa}$ to spacer capacitance $C_{sp}$ is typically approximately 8:1. If e.g. a reduction of the emitter width and of the spacer layer thickness by a factor of 2 in each case is assumed, the ratio is already 4:2. The spacer capacitance thus becomes the performance-limiting factor with advancing component scaling.

It can be seen from equation 2 that the spacer capacitance could be significantly reduced if an insulation material having a lower relative permittivity could be used instead of the dielectric silicon oxide ($\varepsilon_r$=3.9) or silicon nitride ($\varepsilon_r$=7.5).

A further disadvantage of an emitter-base insulation comprising dielectric is the susceptibility to hot carrier stress (see e.g. A. Neugroschl, C. T. Sah, M. S. Caroll, Degradation of bipolar transistor current gain by hot holes during reverse emitter-base stress, IEEE Transactions on Electron Devices, Vol. 43, No. 8, pp. 1286-1290, 1996). Charge carriers that are accelerated in the field of the emitter-base space charge zone may reach the spacer as a result of scattering processes and produce damage (traps) there. These traps subsequently act as recombination centers for the charge carriers, which becomes apparent in an undesirable increase in the base current and thus the decrease in the current gain of the transistor. This effect is also referred to as emitter-base degradation in the literature.

In order as far as possible to avoid the emitter-base degradation, the field strength in the emitter-base space charge zone must not become too large. This limits the maximum dopant concentration that can be used in practice at the emitter-base junction to values of less than approximately $5\times10^{18}$ cm$^{-3}$. Higher dopant concentrations would be desirable, however, in order e.g. to reduce the base resistance of the transistor.

The principle on which the invention is based consists in using a dielectric in the form of a gas or vacuum insulation instead of the known solid spacer, said insulation having a significantly lower relative permittivity. The smallest possible value would be $\epsilon_r=1$, that is to say an insulation with vacuum or specific gases (e.g. air). In comparison with insulations made of oxide or nitride that are used nowadays, such an emitter-base insulation has a spacer capacitance that is smaller by a factor of 3.9 or 7.5. Moreover, the above-mentioned emitter-base degradation should be significantly reduced because a spacer dielectric in which charge carrier traps can be produced by hot carrier stress is not present.

FIGS. 1a-g are schematic illustrations of the method steps of an embodiment according to the invention of the method for the production of a DPSA transistor.

A known production method for the DPSA transistor produced by means of selective SiGe base epitaxy is described thoroughly, as mentioned above, e.g. in DE 199 58 062 C2. The most important production steps for understanding the embodiment depicted, beginning with the selective base deposition, are explained here.

FIG. 1a shows the state of the DPSA transistor prior to the integration of the SiGe base. By way of example, the known shallow trench isolation is used here as insulation. In the case of this planar insulation, the n$^-$-doped collector 25 is laterally insulated by the CVD oxide regions 35. The n$^-$-doped collector 25 lies on the low-impedance, highly As-doped subcollector 10. The n$^-$-type collector 25 is covered by a CVD oxide layer 35' having a thickness of 40-80 nm. A stack comprising the p$^+$-type polysilicon base terminal 40, a further CVD oxide layer 35" and a nitride layer 70 is patterned on the CVD oxide layer 35'. The sidewalls of the emitter window F located above the n$^-$-doped collector 25 are covered by a thin nitride spacer 71a. The nitride layer 71 used for producing said spacer 71a simultaneously serves for protecting the insulation regions of the CVD oxide layer 35' that are located outside the emitter window F from the subsequent wet etching.

By means of this wet etching, as shown in FIG. 1b, the CVD oxide layer 35' is removed in the emitter window F selectively with respect to the surrounding nitride spacer 71a. This isotropic etching is carried out until a p$^+$-polysilicon overhang U of approximately 80 nm has arisen in a self-aligned manner.

Figure 2:
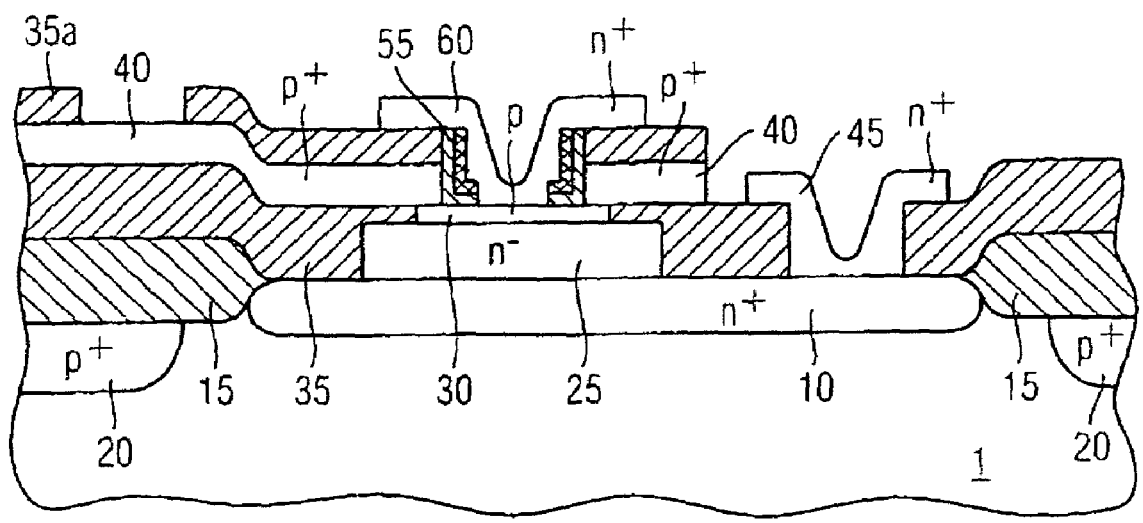
FIG. 2 shows a schematic illustration of a known DPSA transistor.

The p$^+$-doped SiGe base 32 and the lightly doped Si cap (n- or p-) 34 are deposited on the bare silicon region of the n$^-$-type collector 25 by means of selective epitaxy in a CVD reactor, as shown in FIG. 2c.

During the selective epitaxy, C ($1\cdot10^{18}$ cm$^{-3}$-$1\cdot10^{20}$ cm$^{-3}$) is also incorporated in the p$^+$-doped SiGe base in accordance with FIG. 1c in order as far as possible to avoid the diffusion of the boron atoms during the subsequent process steps. The selective deposition of the SiGe/Si layers 32, 34 is carried out until a low-impedance contact with the bare p$^+$-type polysilicon of the base terminal has been achieved. The nitride spacers 71a and the other nitride auxiliary layers 70, 71 are then removed in phosphoric acid selectively with respect to oxide and Si.

Figure 1D:
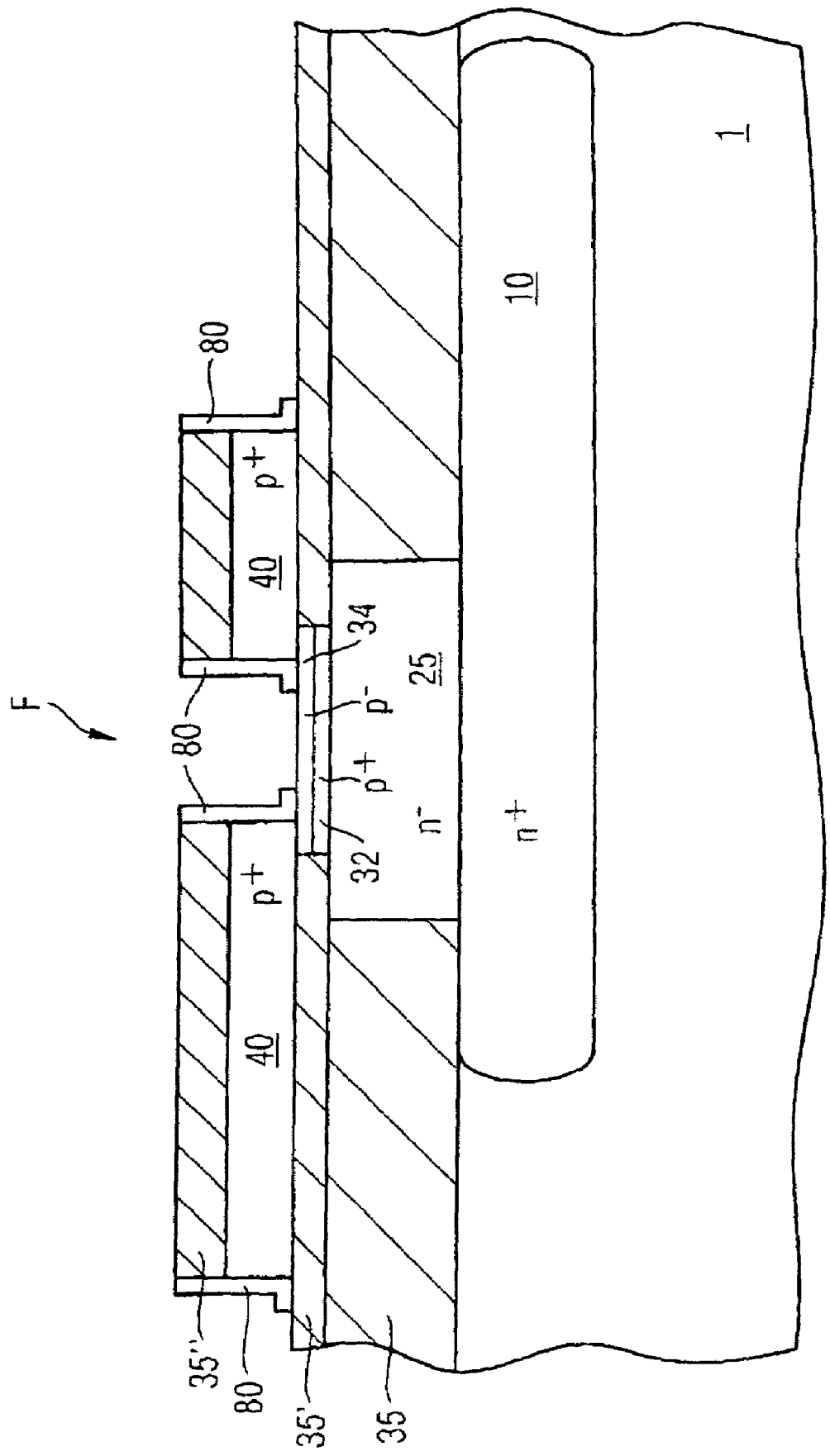

Afterward, in accordance with FIG. 1d, oxide spacers 80 are provided on the sidewalls of the emitter window F, which later insulate the p$^+$-type base terminal 40 from the n$^+$-doped emitter regions or protect the other side edges of the p$^+$-type base terminal 40 during the deposition of the n$^+$-doped emitter polysilicon.

In accordance with FIG. 1e, the n$^+$-doped polycrystalline emitter layer 60 is deposited over the whole area by means of. After this deposition, a thin nitride layer 90 of approximately 20 nm is also applied on the n$^+$-doped emitter layer 60 and the resulting double layer is patterned anisotropically by means of a phototechnology. Then, by means of a thermal step, the n$^+$-type dopant is driven e.g. 20 nm into the underlying monocrystalline Si material of the base cap region 34 in order to form the monocrystalline emitter region (cf. FIG. 3c), not depicted in FIG. 2g.

Figure 1F:
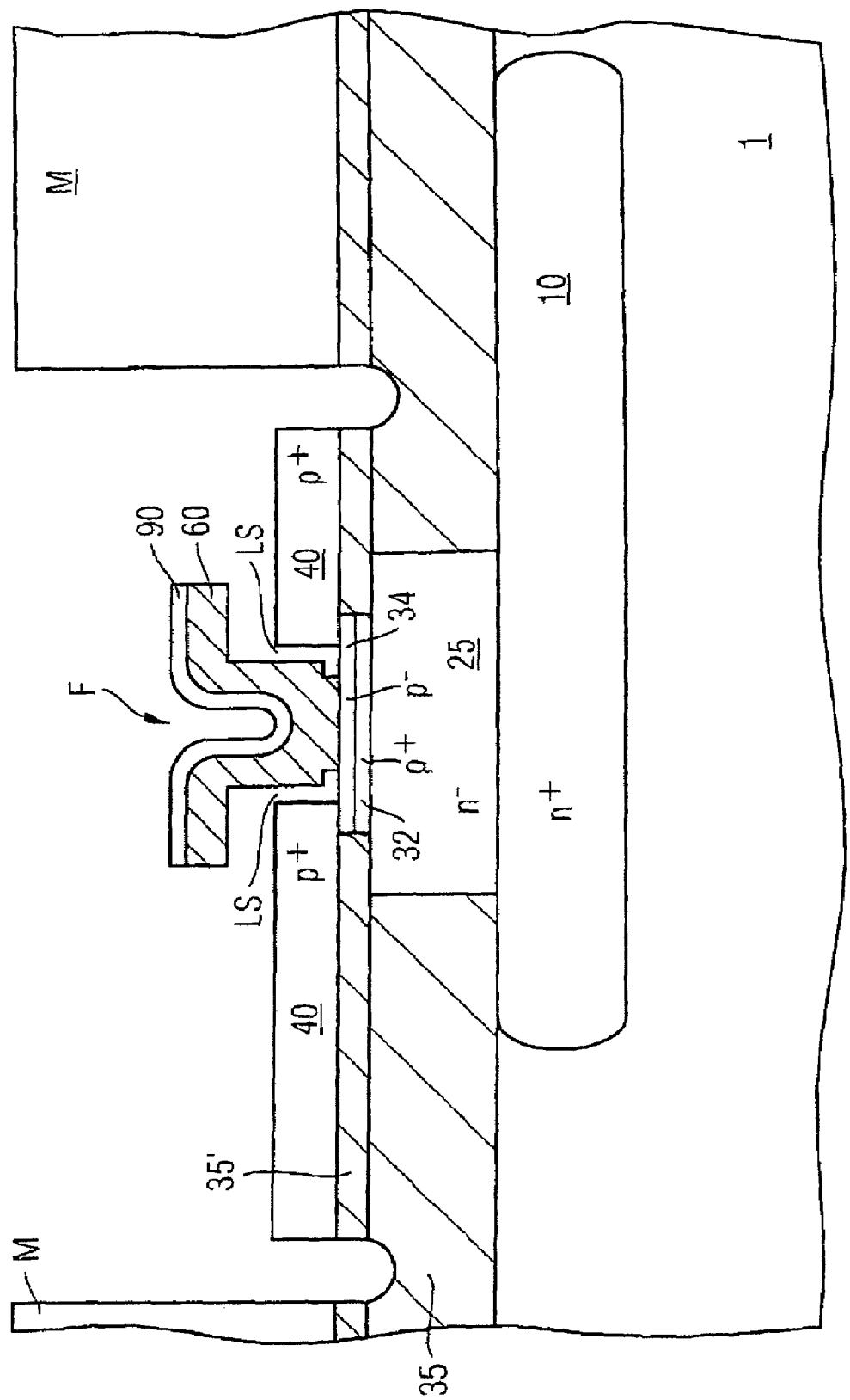

Afterward, in accordance with FIG. 1f, by means of a phototechnology, a resist mask M is provided around the p$^+$-type polysilicon terminal zone of the DPSA transistor, which mask prevents undesirable incipient etching of specific chip regions (e.g. of the insulation zones or of other components) during a subsequent etching process.

The CVD oxide layer 35" and the spacers 80 are then removed by means of an etching selectively with respect to silicon, e.g. using hydrofluoric acid. If, as in the case of the present example, the spacer 80 is made of the same material as the CVD oxide layer 35" above the base terminal region 40, then the etching time of the etching can simply be correspondingly lengthened in comparison with the known process. If it is made of a different material, it is necessary, after etching the CVD oxide layer 35", to change the etchant for etching the spacer. The transistor is then in the state as is shown in FIG. 1f. The desired air gap LS has now arisen between the emitter region 60 and the base terminal region 40.

Afterward, in accordance with FIG. 1g, the mask M is removed and a silicide layer 95 is produced on the bare regions of the p$^+$-type polysilicon of the base terminal 40. An SiO$_2$ layer is then deposited and planarized by chemical mechanical polishing, thus giving rise to an intermediate oxide layer 100 having a thickness of approximately 1500 nm, which covers the entire transistor and closes off the spacer air gap LS without itself filling it again. This requires a deposition process that is not completely edge-covering (conformal). Such processes are known. The deposition processes for the dielectrics between transistor and first metallization plane typically have these properties anyway, so that there is no need to convert the process implementation. It is possible without any problems for air gaps LS having a diameter of a few 10 nm to be closed off without being filled.

FIG. 1g shows the completed DPSA transistor, additionally provided with W contacts 96, 97, 98 to which lines 110, e.g. made of AlCu are connected.

The method according to the invention has been described on the basis of a double polysilicon self-aligned transistor with an inner spacer. However, it is suitable in principle for all components with thin spacers.

List of Reference Symbols
25 Collector region
30 Base region
35,35a,35',35" Oxide layer
40 Base terminal region
80 Oxide side wall spacer
60 Polycrystalline emitter layer
F Emitter window
1 Silicon substrate
10 Subcollector region
70,71 Nitride layer
71a Nitride side wall spacer
U Overhang
32 Base foundation layer 34 Base cap layer
90 Nitride mask
M Photomask
100 Intermediate dielectric
96,97,98 Contacts
110 Contact wiring
95 Silicide

What is claimed is:

1. A method for the production of a bipolar semiconductor component, especially a bipolar transistor, comprising the steps of:
   (a) providing a first semiconductor region of a first conduction type above a semiconductor substrate;
   (b) providing a terminal region of the first conduction type above the semiconductor region;
   (c) providing a first insulation region above the terminal region;
   (d) forming a window in the first insulation region and terminal region for the purpose of at least partly uncovering the semiconductor region;
   (e) providing a sidewall spacer in the window for the purpose of insulating the terminal region;
   (f) providing a second semiconductor region of the second conduction type in such a way that it covers the sidewall spacer and a part of the surrounding first insulation region;
   (g) removing the surrounding first insulation region and the sidewall spacer for the purpose of forming a gap between the terminal region and the second semiconductor region; and
   (h) closing off the gap with a second insulation region whilst simultaneously providing a gas or vacuum atmosphere in the closed-off gap.

2. The method as claimed in claim 1, wherein the first semiconductor region is a base region of a bipolar transistor, below which an associated collector region of the second conduction type is formed beforehand, and the second semiconductor region is the associated emitter region.

3. The method as claimed in claim 1 wherein the first insulation region and the sidewall spacer are made of the same semiconductor material, in particular silicon oxide, and are removed in the same etching process selectively with respect to the first and second semiconductor regions.

4. The method as claimed in claim 1 wherein the second insulation region is formed by non-conformal deposition and planarization of an insulation material.

5. The method as claimed in claim 1, wherein the semiconductor component is a DPSA transistor.

* * * * *